(12) United States Patent
Nariyuki

(10) Patent No.: US 7,923,128 B2
(45) Date of Patent: Apr. 12, 2011

(54) ORGANIC ELECTROLUMINESCENT DEVICE

(75) Inventor: Fumito Nariyuki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1063 days.

(21) Appl. No.: 11/444,422

(22) Filed: Jun. 1, 2006

(65) Prior Publication Data

US 2007/0015004 A1 Jan. 18, 2007

(30) Foreign Application Priority Data

Jun. 7, 2005 (JP) ................. 2005-166817

(51) Int. Cl.
*H01L 51/54* (2006.01)
(52) U.S. Cl. ........ 428/690; 428/917; 313/504; 313/506; 252/301.16; 257/40; 257/E51.051
(58) Field of Classification Search .................. 428/690, 428/917; 313/504, 506; 252/301.16; 257/40, 257/88–103
See application file for complete search history.

(56) References Cited

U.S. PATENT DOCUMENTS

| | | | |
|---|---|---|---|
| 6,603,150 B2 * | 8/2003 | Liao et al. ........... | 257/98 |
| 2002/0071963 A1 * | 6/2002 | Fujii .................. | 428/690 |
| 2004/0211956 A1 * | 10/2004 | Kanno et al. ........ | 257/40 |
| 2005/0258433 A1 * | 11/2005 | Djurovich et al. ... | 257/79 |
| 2006/0057427 A1 * | 3/2006 | Tsukahara et al. .... | 428/690 |

FOREIGN PATENT DOCUMENTS

| | | |
|---|---|---|
| JP | 2000-243574 A | 9/2000 |
| JP | 2001-110568 A | 4/2001 |
| JP | 2001-203081 A | 7/2001 |
| JP | 2001-520450 A | 10/2001 |
| JP | 2003-123984 A | 4/2003 |

OTHER PUBLICATIONS

Ren et al. "Ultrahigh energy gap hosts in deep blue organic electrophosphorescent devices." Chem. Mater. 2004, vol. 16, No. 23, pp. 4743-4747.*
Kazakov et al. "Determination of first ionization potentials from spectra of electronic loss in the vapor of polyatomic organic compounds." J. Appl. Spectrosc. 1999. vol. 66, No. 3, pp. 375-379.*
Japanese Office Action dated Nov. 30, 2010 issued in corresponding Japanese patent application No. 2006-132548.

* cited by examiner

*Primary Examiner* — D. Lawrence Tarazano
*Assistant Examiner* — Michael H Wilson
(74) *Attorney, Agent, or Firm* — Birch, Stewart, Kolasch & Birch, LLP

(57) ABSTRACT

The invention provides an organic electroluminescent device having at least a light-emitting layer containing a light-emitting material and a host material, a hole injection-promoting layer, and a hole-transporting layer containing a hole-transporting material in this order between a pair of electrodes, in which the hole injection-promoting layer contains a hole-transporting material and has a thickness of 0.1 nm to 0.3 nm, and the relationship $Ip1 < Ip2 < Ip3$ is satisfied, when $Ip1$ is defined as the ionization potential of the hole-transporting material of the hole-transporting layer, $Ip2$ is defined as the ionization potential of the hole-transporting material of the hole injection-promoting layer, and $Ip3$ is defined as the ionization potential of the host material. Accordingly, the invention provides an electroluminescent device excellent in both light emitting efficiency and operation durability.

9 Claims, 1 Drawing Sheet

ORGANIC ELECTROLUMINESCENT DEVICE

CROSS-REFERENCE TO RELATED APPLICATION

This application claims priority under 35 USC 119 from Japanese Patent Application No.-2005-166817, the disclosure of which is incorporated by reference herein.

BACKGROUND OF THE INVENTION

1. Field of the Invention

The invention relates to an organic electroluminescent device (hereinafter referred to as organic EL device, electroluminescent device, or EL device) for emitting light by converting electric energy to light.

2. Description of the Related Art

Investigation and development of various kinds of display devices is flourishing and organic electroluminescent (organic EL) devices in particular have drawn attention as up-and-coming display devices, since bright light emission can be achieved at low voltage.

An organic electroluminescent device comprises a pair of counter electrodes sandwiching a light-emitting layer, or plural organic layers including a light-emitting layer, and emitting light based on electroluminescence from an exciton, produced by recombination in the light-emitting layer of an electron injected from a cathode and a hole injected from an anode, or based on electroluminescent from an exciton of another molecule produced by energy transfer from such an exciton.

However, organic electroluminescent devices need further improved light emitting efficiency and durability particularly, in blue- and green-emission.

To address the above-mentioned issues, in order to improve the operational efficiency of a device, techniques for forming a carrier flow rate suppressing layer for adjusting the balance of the carrier recombination have been disclosed.

For example, an organic EL device comprising a hole flow rate-suppressing layer having a smaller ionization potential (hereinafter sometimes referred to as IP) than a hole-transporting layer provided between the hole-transporting layer, and the light-emitting layer is disclosed (e.g. Japanese Patent Application Laid-Open (JP-A) No. 2000-243574).

Also, an organic electroluminescent device comprising an interface layer (a hole flow rate-suppressing layer) with a thickness of 0.1 to 5 nm and having higher IP than a hole-transporting layer and higher energy band gap than a light-emitting layer between the hole-transporting layer and light-emitting layer is disclosed (e.g. reference to JP-A No. 2003-123984)

That is, the correlations of IP among the hole flow rate-suppressing layer and respective organic layers are classified as follows: as shown in FIG. 1A and FIG. 1B, (IP of hole-transporting layer)>(IP of hole flow rate-suppressing layer)<(IP of light-emitting layer) in the case of JP-A No. 2000-243574; and (IP of hole-transporting layer)<(IP of hole flow rate-suppressing layer)>(IP of light-emitting layer) in the case of JP-A No. 2003-123984.

However, formation of the layer for suppressing the injection of the hole involves a problem that the charge stagnates at the interface of (hole-transporting layer/hole flow rate-suppressing layer) or at the interface of (hole flow rate-suppressing layer/light emitting layer) and this accelerates the deterioration of the materials and thus these devices have insufficient operational durability.

SUMMARY OF THE INVENTION

The invention has been made in view of the above circumstances and provides an organic electroluminescent device.

According to an aspect of the invention, the invention provides an organic electroluminescent device comprising: a light-emitting layer containing a light-emitting material and a host material; a hole injection-promoting layer; and a hole-transporting layer containing a hole-transporting material; provided in this order between a pair of electrodes; wherein the hole injection-promoting layer contains a hole-transporting material and has a thickness of 0.1 nm to 3 nm; and the relationship $Ip1<Ip2<Ip3$ is satisfied, when Ip1 is defined as the ionization potential of the hole-transporting material of the hole-transporting layer, Ip2 is defined as the ionization potential of the hole-transporting material of the hole injection-promoting layer, and Ip3 is defined as the ionization potential of the host material.

DETAILED DESCRIPTION OF THE INVENTION

Figure 1A:
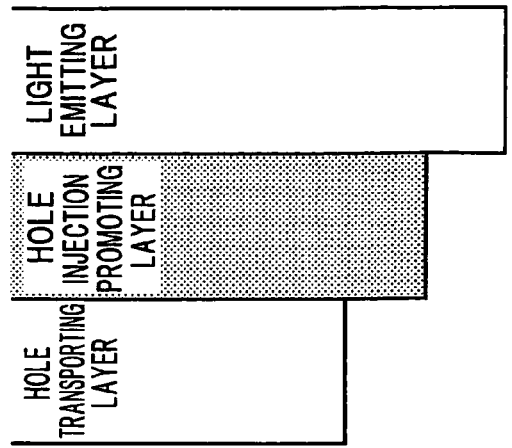
FIG. 1A is a schematic drawing showing the relative relation of the ionization potential IP among the respective organic layers of the electroluminescent device disclosed in JP-A 2000-243574.

The inventors of the invention have made various investigations and have found both high light emitting efficiency and high operation durability can be accomplished by forming an hole injection-promoting layer between the hole-transporting layer and light-emitting layer and controlling the thickness of the layer to be 3 nm or thinner and these findings have now led to completion of the invention.

That is, the invention provides the following.

<1> An organic electroluminescent device comprising: a light-emitting layer containing a light-emitting material and a host material; a hole injection-promoting layer; and a hole-transporting layer containing a hole-transporting material; provided in this order between a pair of electrodes; in which the hole injection-promoting layer contains a hole-transporting material and has a thickness of 0.1 nm to 3 nm, and satisfying $Ip1<Ip2<Ip3$ is satisfied, when Ip1 is defined as the ionization potential of the hole-transporting material of the hole-transporting layer, Ip2 is defined as the ionization potential of the hole-transporting material of the hole injection-promoting layer, and Ip3 is defined as the ionization potential of the host material.

<2> The organic electroluminescent device as described in <1> in which the light-emitting material is a phosphorescence emitting material.

<3> The organic electroluminescent device as described in <2> in which the phosphorescence-emitting material is a complex containing a transition metal atom or a lanthanide atom.

<4> The organic electroluminescent device as described in <1> in which the hole injection-promoting layer has a film thickness in a range from 0.1 nm to 2 nm.

<5> The organic electroluminescent device as described in <1> in which the ionization potential Ip2 of the hole-transporting material of the hole injection-promoting layer is 5.4 eV or higher.

<6> The organic electroluminescent device as described in <1> in which the electron affinity of the hole-transporting material of the hole injection-promoting layer is 2.3 eV or higher.

<7> The organic electroluminescent device as described in <1> in which the hole injection-promoting layer is adjacent to the light-emitting layer in the anode side.

<8> The organic electroluminescent device as described in <1> in which the hole-transporting material of the hole injection-promoting layer is defined by the following formula (A-1):

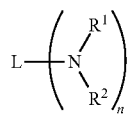

formula (A-1)

wherein in the formula: $R^1$ and $R^2$ independently denote a hydrogen atom, an aliphatic hydrocarbon group, an aromatic hydrocarbon group, or a heterocyclic group; L denotes a di- or higher valent bonding group; n denotes an integer of 2 or larger; and plural groups defined respectively by $R^1$ or $R^2$ may be the same or different from each other.

<9> The organic electroluminescent device as described in <8> in which the hole-transporting material of the hole injection-promoting layer is defined by the following formula (A-2):

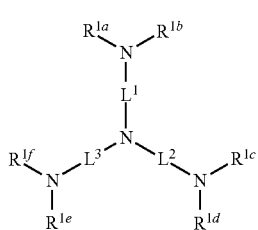

formula (A-2)

wherein in the formula: $R^{1a}$, $R^{1b}$, $R^{1c}$, $R^{1d}$, $R^{1e}$, and $R^{1f}$ independently denote a hydrogen atom, an aliphatic hydrocarbon group, an aromatic hydrocarbon group, or a heterocyclic group; and $L^1$, $L^2$, and $L^3$ independently denote a di- or higher valent bonding group).

According to the invention, an organic electroluminescent device having both satisfactorily high light emitting efficiency and high operation durability and phosphorescence-emitting property, particularly blue color phosphorescence-emitting property.

Hereinafter, an organic electroluminescent device of the invention (hereinafter, occasionally referred to as organic EL device) will be described in detail.

The organic electroluminescent device of the invention comprises at least a light-emitting layer containing a light-emitting material and a host material, a hole injection-promoting layer, and a hole-transporting layer containing a hole-transporting material in this order between a pair of electrodes and is characterized in that the hole injection-promoting layer contains a hole-transporting material and has a thickness of 0.1 nm or thicker and 3 nm or thinner, and satisfies Ip1<Ip2<Ip3 in the case Ip1 is defined as the ionization potential of the hole-transporting material of the hole-transporting layer; Ip2 is defined as the ionization potential of the hole-transporting material of the hole injection-promoting layer; and Ip3 is defined as the ionization potential of the host material.

With the above-mentioned constitution, the organic electroluminescent device of the invention is provided with an improved light emitting efficiency and simultaneously excellent operation durability.

It is assumed that the particularly excellent operation durability of the electroluminescent device of the invention is owing to the following mechanism.

It is supposed that the light emitting efficiency is improved by improving the injection of a hole to a light-emitting layer by a hole-transporting material contained in a hole injection-promoting layer.

Further, in the invention, hole injection to the light-emitting layer is promoted by satisfying the following relation, Ip1<Ip2<Ip3, in the case Ip1 is defined as the IP of the hole-transporting material of the hole-transporting layer; Ip2 is defined as the IP of the hole-transporting material of the hole injection-promoting layer; and Ip3 is defined as the IP of the host material of the light-emitting layer and also the hole injection barrier is lowered and electric charge stagnation in the interface of layers is suppressed and as a result, the material deterioration is suppressed and the operation durability is therefore improved.

However, if the thickness of the hole injection-promoting layer is made thick, an electron is injected to the hole-transporting material contained therein and the material tends to be decomposed easily. In the invention, it is supposed that since the film thickness of the hole injection-promoting layer is adjusted to be 3 nm or thinner, the decomposition of the hole-transporting material is avoided and it results in improvement of the operation durability. It means that no electron is injected to the hole-transporting material and it may be attributed to that the hole injection-promoting layer is not in form of a film but like islands.

The film thickness in the invention means the average film thickness. Previously a single film of each material in a thickness of about 50 to 200 nm is formed and the thickness of the film is measured by means such as a step measurement meter or an optical film thickness measurement system and at the time of device fabrication, the film thickness is set by conversion based on the measured values.

In the invention, use of a phosphorescent material as the light-emitting material brings a particularly significant effect. In a phosphorescence-emitting device, since the exciton life is long, the shift of carrier balance in the light-emitting layer causes a considerable effect on the light emitting efficiency, however, according to the invention, the carrier balance is improved.

The ionization potential (IP) to be employed in the invention is defined as the value measured at a room temperature and atmospheric pressure using an AC-1 (manufactured by Riken Keiki Co., Ltd.). The measurement principle of AC-1 is described in Chihaya ADACHI et al, Collective Data of Work Function of Organic Thin Film (Yuki Hakumaku Shigoto Kansu Data Shu), published by CMC PUBLISHING CO., LTD. (2004), the disclosure of which is incorporated by reference herein.

With respect to materials whose ionization potential exceeds 6.2 eV, USP (Vacuum Ultraviolet Photoelectron Spectrometry) method is employed because of the measurement range. The electron affinity is defined as a value calculated from a band gap measured from the long-wave end of the absorption spectrum of a single layer film and the ionization potential measured separately.

Next, the constitution of the organic electroluminescent device of the invention will be described.

The organic electroluminescent device of the invention comprises a pair of a cathode and an anode and between both of the electrodes, at least a light-emitting layer, a hole-transporting layer, and a hole injection-promoting layer inserted in the light-emitting layer and the hole-transporting layer. The hole injection-promoting layer is preferably formed closer to the anode side of the light-emitting layer.

Also, the cathode and the anode are preferably formed respectively on substrates. Further, other organic compound layers may be formed between the hole-transporting layer and the anode and between the light-emitting layer and the cathode.

From a viewpoint of the characteristics of the electroluminescent device, at least one electrode between the anode and the cathode is preferably transparent. In general, the anode is transparent.

With respect to the layer structure of the organic electroluminescent device of the invention, it is preferable to layer the hole-transporting layer, the hole injection-promoting layer, and the light-emitting layer in this order from the anode side. Further, a charge-blocking layer may be formed between an electron-transporting layer and the light-emitting layer.

In the invention, the respective layers including the light-emitting layer formed between the pair of electrodes are generically named organic compound layer.

Next, the respective elements composing the invention will be described in detail.

<Substrate>

The substrate to be used in the invention is preferably a substrate which does not scatter or decrease light emitted from the light-emitting layer. Specific examples of materials of the substrate include inorganic materials such as zirconia-stabilized yttrium (YSZ) and glass and organic materials such as polyesters, e.g. polyethylene terephthalate, polybutylene terephthalate and polyethylene naphthalate, polystyrenes, polycarbonates, polyether sulfones, polyallylates, polyimides, polycycloolefins, norbornene resins, and poly(chlorotrifluoroethylene).

For example, in the case glass is used for the substrate, with respect to the quality of the glass, alkali-free glass is preferably used in order to suppress ion elution. In the case soda lime glass is used, it is preferable to use those coated with a barrier coat of silica or the like. In the case of an organic material, those which are excellent in heat resistance, size stability, solvent resistance, electric insulation property, and processability are preferably used.

The shape, structure, and size of the substrate are not particularly limited and may properly be selected in accordance with the application and use of the electroluminescent device. In general, the shape of the substrate is preferably like a plate. The structure of the substrate may be a single-layer structure or a multilayer structure and also may be made of a single material or two or more materials.

The substrate may be colorless and transparent or colored and transparent, however from a viewpoint of suppressed scattering and decreasing of light emitted form the light-emitting layer, it is preferably colorless and transparent.

A moisture permeation prevention layer (a gas barrier layer) may be formed on the front or the rear face of the substrate.

A material for the moisture permeation prevention layer (the gas barrier layer) is preferably an inorganic material such as silicon nitride and silicon oxide. The moisture permeation prevention layer (the gas barrier layer) may be formed by, for example, a high frequency sputtering method.

In the case of using a thermoplastic substrate, a hard coat layer and an under coat layer may be formed based on the necessity.

<Anode>

The anode is proper, in general, if it has a function as an electrode for supplying hole to the above-mentioned organic compound layer and the shape, structure, and size of it are not particularly limited. It may be selected from conventionally known electrode materials in accordance with the application and use of the electroluminescent device. As described above, the anode is installed generally as a transparent anode.

A material of the anode is preferably, for example, a metal, an alloy, a metal oxide, a conductive compound, or mixtures thereof. And materials having a work function of 4.0 eV or higher are preferable. Specific examples of the anode material are conductive metal oxides such as tin oxide doped with antimony or fluorine (ATO, FTO), tin oxide, zinc oxide, indium oxide, indium tin oxide (ITO), and zinc indium oxide (IZO); metals such as gold, silver, chromium, and nickel; mixtures or layered materials of these metals and conductive metal oxides; inorganic conductive substances such as copper iodide and copper sulfide; organic conductive materials such as polyaniline, polythiophene, and polypyrrole; and layered materials of these materials and ITO. Preferable examples among them are conductive metal oxides and particularly, ITO is preferable in terms of the productivity, high conductivity, and transparency.

The anode can be formed on the substrate by a method properly selected from wet methods such as a printing method and a coating method; physical methods such as a vacuum evaporation method, a sputtering method, and an ion plating method; and chemical methods such as CVD and plasma CVD in consideration of the applicability of the material composing the anode. For example, in the case ITO is selected as the material for the anode, the anode formation may be carried out by a DC or high frequency sputtering method, a vacuum evaporation method, and an ion plating method.

In the organic electroluminescent device of the invention, the formation position of the anode is not particularly limited and may be selected properly in accordance with the application and use of the electroluminescent device, however, it is preferably formed on the substrate. In this case, the anode may be formed entirely or partially on one face of the substrate.

Additionally, at the time of patterning for forming the anode, it may be carried out by chemical etching in photolithography or physical etching by laser, or by vacuum evaporation or sputtering using a mask, or by a lift-off method or a printing method.

The thickness of the anode may be selected properly depending on the material composing the anode and cannot strictly be limited, however in general, it is about 10 nm to 50 μm and preferably 50 nm to 20 μm.

The resistance value of the anode is preferably $10^3$ Ω/cm$^2$ or lower and more preferably $10^2$ Ω/cm$^2$ or lower. In the case the anode is transparent, it may be colorless transparent or colored transparent. To draw light emission from the transparent anode, the transmittance is preferably 60% or higher and more preferably 70% or higher.

With respect to a transparent anode, detailed description is presented in Yutaka SAWADA, New Development of Transparent Conductive Film (Tomei Dodemaku no Shin Tenkai), published by CMC PUBLISHING CO., LTD. (1999), the disclosure of which is incorporated by reference herein. In the case of using a plastic substrate with low heat resistance, it is preferable to use ITO or IZO and to form a transparent anode at a temperature as low as 150° C. or lower.

<Cathode>

The cathode is proper, in general, if it has a function as an electrode for supplying electron to the above-mentioned organic compound layer and the shape, structure, and size of it are not particularly limited. It may be selected from conventionally known electrode materials in accordance with the application and use of the electroluminescent device.

A material of the cathode is preferably, for example, a metal, an alloy, a metal oxide, a conductive compound, or mixtures thereof and materials having a work function of 4.5 eV or lower are preferable. Specific examples are alkali metals (e.g. Li, Na, K, and Cs), alkaline earth metals (e.g. Mg and Ca), gold, silver, lead, aluminum, sodium-potassium alloy, lithium-aluminum alloy, magnesium-silver alloy, indium, and rare earth metals such as ytterbium. They may be used alone, however, from a viewpoint that both of the stability and electron injection properties are satisfied, two or more of them are preferably used in combination.

As a material composing the cathode among them are alkali metals and alkaline earth metals which are preferable in terms of the electron injection property and aluminum-based materials which are preferable in terms of storage stability.

The aluminum-based materials include aluminum itself, alloys or mixtures of aluminum with 0.01 to 10% by mass of alkali metals or alkaline earth metals (e.g. lithium-aluminum alloy and magnesium-aluminum alloy).

JP-A Nos. 2-15595 and 5-121172 describe materials for a cathode and the materials described in these references may be employed in the invention.

A cathode formation method is not particularly limited and may be carried out by a conventionally known method. For example, the cathode can be formed by a method properly selected from wet methods such as a printing method and a coating method; physical methods such as a vacuum evaporation method, a sputtering method, and an ion plating method; and chemical methods such as CVD and plasma CVD in consideration of the applicability of the material composing the cathode. For example, in the case metals are selected as the material for the cathode, the cathode formation may be carried out by sputtering one kind metal or simultaneously or successively sputtering two or more kind metals.

Additionally, at the time of patterning for forming the cathode, it may be carried out by chemical etching in photolithography or physical etching by laser, or by vacuum evaporation or sputtering using a mask, or by a lift-off method or a printing method.

In the invention, the formation position of the cathode is not particularly limited and the cathode may be formed entirely or partially on the organic compound layer.

A dielectric layer of a fluoride or an oxide of alkali metals or alkaline earth metals in a thickness of 0.1 to 5 nm may be inserted between the cathode and the organic compound layer. The dielectric layer may be regarded as one kind of electron injection layers. The dielectric layer may be formed by a vacuum evaporation method, a sputtering method, and an ion plating method.

The thickness of the cathode may be selected properly depending on the material composing the cathode and cannot strictly be limited, however, in general, it is about 10 nm to 5 μm and preferably 50 nm to 1 μm.

The cathode may be transparent or opaque. The transparent cathode may be formed by forming a cathode material in a film with a thickness as thin as 1 to 10 nm and layering a transparent conductive material such as ITO and IZO.

<Organic Compound Layer>

The organic electroluminescent device of the invention comprises the light-emitting layer, the hole-transporting layer, and a hole injection-promoting layer between the light-emitting layer and the hole-transporting layer and as described above, may comprise other layers.

Other layers may include an electron-transporting layer, a charge blocking layer, hole-injecting layer, and an electron-injecting layer.

The layers adjacent to the light-emitting layer in the cathode side may be the electron-injecting layer, the electron-transporting layer, and hole-blocking layer and preferably the electron-transporting layer. These layers will be described in detail later.

—Formation of Organic Compound Layer—

The respective layers composing the organic layers may be formed preferably by a dry film formation method such as an evaporation method and a sputtering method; a transfer method; and a printing method.

—Light-Emitting Layer—

The light-emitting layer is a layer for receiving a hole from the anode, the hole-injecting layer, or a hole-transporting layer and an electron from the cathode, the electron-injecting layer, or an electron-transporting layer, providing a field for recombination of the hole and the electron, and thus having a function of emitting luminescence.

The light-emitting layer in the invention contains a dopant including a light-emitting material and a host material. The light-emitting material is preferably a phosphorescence-emitting material. The host material is not particularly limited, however, it is preferably a charge-transporting material.

There may be one or more light-emitting layers.

The phosphorescence-emitting material to be contained in the light-emitting layer is generally a complex containing a transition metal atom or a lanthanide atom.

The transition metal atom is not particularly limited and includes preferably ruthenium, rhodium, palladium, tungsten, rhenium, osmium, iridium, and platinum, more preferably rhenium, iridium, and platinum.

The lanthanide atom includes lanthanum, cerium, praseodymium, neodymium, samarium, europium, gadolinium, terbium, dysprosium, holmium, erbium, thulium, ytterbium, and lutetium. Among these lanthanide atoms, neodymium, europium, and gadolinium are preferable.

A ligand of the complex may include ligands described in G Wilkinson et al, Comprehensive Coordination Chemistry, Pergamon Press (1987); H. Yersin, Photochemistry and Photophysics of Coordination Compounds, Springer-Verlag (1987); and Akio YAMAMOTO, Organometal Chemistry, Basics and Applications (Yuki-Kinzoku Kagaku, Kiso to Oyo), Shokabo (1982).

Specific examples of the ligand are preferably halogen ligands (preferably chlorine ligand), nitrogen-containing heterocyclic ligands (e.g. phenylpyridine, benzoquinoline, quinolinol, dipyridyl, and phenanthroline), diketone ligands (e.g. acetylacetone), carboxylic acid ligands (e.g. acetic acid ligand), carbon monoxide ligand, isonitrile ligand, and cyano ligand and more preferably nitrogen-containing heterocyclic ligands. The above-mentioned complex may contain one transition metal atom in the compound or may be so-called binuclear complex containing two or more transition metal atoms. Also, the compound may contain different types of metal atoms simultaneously.

The light-emitting material is contained preferably in an amount of 0.1 to 20% by mass, more preferably 0.5 to 10% by mass, in the light-emitting layer.

The host material to be contained in the light-emitting layer in the invention may be those having a carbazole skeleton, a diarylamine skeleton, a pyridine skeleton, a pyrazine skeleton, a triazine skeleton, and an arylsilane skeleton and it is not particularly limited, however, those having a carbazole skeleton are preferable.

The $T_1$ of the host material (energy level in the minimum multiplet excitation state) is preferably higher than the $T_1$ level of the dopant material. The light-emitting layer is preferably formed by co-depositing a host material and a dopant material to dope the host material with the dopant material.

The thickness of the light-emitting layer is not particularly limited and it is, in general, preferably 1 nm to 500 nm, more preferably 5 nm to 200 nm, and even more preferably 10 nm to 100 nm.

—Hole Injection-Promoting Layer—

The hole injection-promoting layer is a layer having a function of promoting hole injection to the light-emitting layer from the anode side. In the invention, as an organic compound layer adjacent to the light-emitting layer in the anode side, it is preferable to form a hole injection-promoting layer.

The ionization potential of the hole-transporting material contained in the hole injection-promoting layer is preferably 5.4 eV or higher and more preferably 5.7 eV or higher.

The electron affinity (Ea) of the hole-transporting material contained in the hole injection-promoting layer is preferably 2.3 eV or higher and more preferably 2.5 eV or higher in order to prevent leakage of electron from the light-emitting layer and thus to improve the light emitting efficiency.

The thickness of the hole injection-promoting layer is essentially 3 nm or thinner, and preferably 0.1 to 2 nm, and more preferably 0.1 nm to 1.5 nm.

The above-mentioned hole-transporting materials to be used for the hole injection-promoting layer in the invention may be used alone or two or more materials may be used in combination.

One preferable embodiment of the hole injection-promoting layer of the invention is a hole injection-promoting layer consisting of a hole-transporting material alone, however, the layer may contain other materials.

The hole mobility of the hole-transporting material to be used for the hole injection-promoting layer in the invention is preferably $1 \times 10^{-5}$ cm$^2$/Vs or more and more preferably $1 \times 10^{-4}$ cm$^2$/Vs or more from a viewpoint of sufficient hole injection to the light-emitting layer.

The hole mobility of the hole-transporting material can be measured by TOF (Time of Flight) method and in the invention, the value measured by TOF method is employed.

Specific examples of the compound to be used for the hole injection-promoting layer are compounds having an aromatic hydrocarbon ring; compounds having an aromatic heterocyclic ring; arylamine derivatives; azole derivatives such as carbazole; polyarylalkane derivatives; pyrazoline derivatives; pyrazolone derivatives; amino-substituted chalcone derivatives; styrylanthracene derivatives; fluorenone derivatives; hydrazone derivatives; stilbene derivatives; styrylamine compounds; and aromatic dimethylidyne compounds.

The compound to be used for the hole injection-promoting layer is preferably a compound defined by the following formula (A-1).

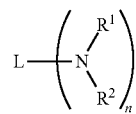

formula (A-1)

In the formula (A-1), $R^1$ and $R^2$ independently denote a hydrogen atom, an aliphatic hydrocarbon group, an aromatic hydrocarbon group, or a heterocyclic group; L denotes di- or higher valent bonding group; n denotes an integer of 2 or larger; plural groups defined by $R^1$ and $R^2$ may be same or different.

Examples of the aliphatic hydrocarbon group denoted by $R^1$ and $R^2$ are preferably an alkyl group (preferably having 1 to 30 carbon atoms, more preferably having 1 to 20 carbon atoms, and even more preferably having 1 to 10 carbon atoms, e.g. methyl, ethyl, iso-propyl, tert-butyl, n-octyl, n-decyl, n-hexadecyl, cyclopropyl, cyclopentyl, and cyclohexyl); an alkenyl group (preferably having 2 to 30 carbon atoms, more preferably having 2 to 20 carbon atoms, and even more preferably having 2 to 10 carbon atoms, e.g. vinyl, allyl, 2-butenyl, and 3-pentenyl); an alkinyl group (preferably having 2 to 30 carbon atoms, more preferably having 2 to 20 carbon atoms, and even more preferably having 2 to 10 carbon atoms, e.g. propargyl, and 3-pentinyl); and more preferably an alkyl, further more preferably an alkyl having 1 to 20 carbon atoms, and even more preferably an alkyl having 1 to 10 carbon atoms.

The aromatic hydrocarbon group denoted by $R^1$ and $R^2$ are preferable to have 6 to 30 carbon atoms, more preferable to have 6 to 20 carbon atoms, and even more preferable to have 6 to 12 carbon atoms and examples are phenyl, naphthyl, anthranyl, phenanthryl, and pyrenyl.

The heterocyclic group denoted by $R^1$ and $R^2$ are a monocyclic ring or a condensed ring containing at least one of nitrogen atom, oxygen atom, and sulfur atom and are preferable to have 1 to 30 carbon atoms, more preferable to have 1 to 12 carbon atoms, and even more preferable to have 1 to 10 carbon atoms. Specific examples of the heterocyclic group are imidazolyl, pyridyl, quinolyl, furyl, thienyl, piperidyl, morpholino, benzoxazolyl, benzimidazolyl, benzthiazolyl, carbazolyl, and azepinyl.

$R^1$ and $R^2$ may have a substituent group and examples of the substituent group are an alkyl group (preferably having 1 to 30 carbon atoms, more preferably having 1 to 20 carbon atoms, and even more preferably having 1 to 10 carbon atoms, e.g. methyl, ethyl, iso-propyl, tert-butyl, n-octyl, n-decyl, n-hexadecyl, cyclopropyl, cyclopentyl, and cyclohexyl); an alkenyl group (preferably having 2 to 30 carbon atoms, more preferably having 2 to 20 carbon atoms, and even more preferably having 2 to 10 carbon atoms, e.g. vinyl, allyl, 2-butenyl, and 3-pentenyl); an alkinyl group (preferably having 2 to 30 carbon atoms, more preferably having 2 to 20 carbon atoms, and even more preferably having 2 to 10 carbon atoms, e.g. propargyl, and 3-pentinyl); an aryl group (preferably having 6 to 30 carbon atoms, more preferably having 6 to 20 carbon atoms, and even more preferably having 6 to 12 carbon atoms, e.g. phenyl, p-methylphenyl, naphthyl, and anthranyl); an amino group (preferably having 0 to 30 carbon atoms, more preferably having 0 to 20 carbon atoms, and even more preferably having 0 to 10 carbon atoms, e.g. amino, methylamino, dimethylamino, diethylamino, benzylamino, diphenylamino, and ditolylamino); an alkoxy group (preferably having 1 to 30 carbon atoms, more preferably having 1 to 20 carbon atoms, and even more preferably having 1 to 10 carbon atoms, e.g. methoxy, ethoxy, butoxy, and 2-ethylhexyoxy); an aryloxy group (preferably having 6 to 30 carbon atoms, more preferably having 6 to 20 carbon atoms, and even more preferably having 6 to 12 carbon atoms, e.g. phenyloxy, 1-naphthyloxy, and 2-naphthyloxy); a heterocyclic oxy group (preferably having 1 to 30 carbon atoms, more preferably having 1 to 20 carbon atoms, and even more preferably having 1 to 12 carbon atoms, e.g. pyridyloxy, pyrazinyloxy, pyrimidyloxy, and quinolyloxy); an acyl group (preferably having 1 to 30 carbon atoms, more preferably having 1 to 20 carbon atoms, and even more preferably having 1 to 12 carbon atoms, e.g. acetyl, benzoyl, formyl, and pivaloyl); an alkoxycarbonyl group (preferably having 2 to 30 carbon atoms, more preferably having 2 to 20 carbon atoms, and even more preferably having 2 to 12 carbon atoms, e.g. methoxycarbonyl and ethoxycarbonyl); an aryloxycarbonyl group (preferably having 7 to 30 carbon atoms, more preferably having 7 to 20 carbon atoms, and even more preferably having 7 to 12 carbon atoms, e.g. phenyloxycarbonyl); an acyloxy group (preferably having 1 to 30 carbon atoms, more preferably having 1 to 20 carbon atoms, and even more preferably having 1 to 10 carbon atoms, e.g. acetoxy and benzoyloxy); an acylamino group (preferably having 1 to 30 carbon atoms, more preferably having 1 to 20 carbon atoms, and even more preferably having 1 to 10 carbon atoms, e.g. acetylamino and benzoylamino); an alkoxycarbonylamino group (preferably having 2 to 30 carbon atoms, more preferably having 2 to 20 carbon atoms, and even more preferably having 2 to 12 carbon atoms, e.g. methoxycarbonylamino); an aryloxycarbonylamino group (preferably having 7 to 30 carbon atoms, more preferably having 7 to 20 carbon atoms, and even more preferably having 7 to 12 carbon atoms, e.g. phenyloxycarbonylamino); a sulfonylamino group (preferably having 1 to 30 carbon atoms, more preferably having 1 to 20 carbon atoms, and even more preferably having 1 to 12 carbon atoms, e.g. methanesulfonylamino and benzenesulfonylamino); a sulfamoyl group (preferably having 0 to 30 carbon atoms, more preferably having 0 to 20 carbon atoms, and even more preferably having 0 to 12 carbon atoms, e.g. sulfamoyl, methylsulfamoyl, demethylsulfamoyl, and phenylsulfamoyl); a carbamoyl group (preferably having 1 to 30 carbon atoms, more preferably having 1 to 20 carbon atoms, and even more preferably having 1 to 12 carbon atoms, e.g. carbamoyl, methylcarbamoyl, diethylcarbamoyl, and phenylcarbamoyl); an alkylthio group (preferably having 1 to 30 carbon atoms, more preferably having 1 to 20 carbon atoms, and even more preferably having 1 to 12 carbon atoms, e.g. methylthio and ethylthio); an arylthio group (preferably having 6 to 30 carbon atoms, more preferably having 6 to 20 carbon atoms, and even more preferably having 6 to 12 carbon atoms, e.g. phenylthio); a heterocyclic thio group (preferably having 1 to 30 carbon atoms, more preferably having 1 to 20 carbon atoms, and even more preferably having 1 to 12 carbon atoms, e.g. pyridylthio, 2-benzimidazolylthio, 2-benzoxazolylthio, and 2-benzthiazolylthio); a sulfonyl group (preferably having 1 to 30 carbon atoms, more preferably having 1 to 20 carbon atoms, and even more preferably having 1 to 12 carbon atoms, e.g. mesyl and tosyl); a sulfinyl group (preferably having 1 to 30 carbon atoms, more preferably having 1 to 20 carbon atoms, and even more preferably having 1 to 12 carbon atoms, e.g. methanesulfinyl and benzenesulfinyl); an ureido group (preferably having 1 to 30 carbon atoms, more preferably having 1 to 20 carbon atoms, and even more preferably having 1 to 12 carbon atoms, e.g. ureido, methylureido, and phenylureido); a phosphoric acid amido group (preferably having 1 to 30 carbon atoms, more preferably having 1 to 20 carbon atoms, and even more preferably having 1 to 12 carbon atoms, e.g. diethylphosphoric acid amido and phenyl phosphoric acid amido); a hydroxy group, a mercapto group, a halogen atom (e.g. fluorine atom, chlorine atom, bromine atom, and iodine atom); a cyano group, a sulfo group, a carboxyl group, a nitro group, a hydroxamic acid group, a sulfino group, a hydrazino group, an imino group, a heterocyclic group (preferably having 1 to 30 carbon atoms and more preferably having 1 to 12 and nitrogen atom, oxygen atom, and sulfur atom as a hetero atom, e.g. imidazolyl, pyridyl, quinolyl, thienyl, piperidinyl, morpholino, benzoxazolyl, benzimidazolyl, benzthiazolyl, carbazolyl, and azepinyl); a silyl group (preferably having 3 to 40 carbon atoms, more preferably having 3 to 30 carbon atoms, and even more preferably having 3 to 24 carbon atoms, e.g. trimethylsilyl and triphenylsilyl); a silyloxy group (preferably having 3 to 40 carbon atoms, more preferably having 3 to 30 carbon atoms, and even more preferably having 3 to 24 carbon atoms, e.g. trimethylsilyloxy and triphenylsilyloxy). These substituent groups may further have substituent groups. $R^1$ and $R^2$, $R^1$ and L, and $R^2$ and L may be bonded each other to form a ring or the substituent groups may be bonded each other to form a ring.

The substituent groups are preferably an alkyl, an aryl, an aromatic heterocyclic group, or a ring formed by being bonded each other.

$R^1$ and $R^2$ are preferably an aromatic hydrocarbon group and more preferably (un)substituted phenyl, naphthyl, anthracenyl, phenanethryl, and pyrenyl and even more preferably (un)substituted phenyl and naphthyl.

The divalent bonding group denoted by L is preferably a bonding group consisting of a carbon atom, a nitrogen atom, an oxygen atom, a sulfur atom, and a silicon atom and specific examples are exemplified below. However, it is not limited to these groups.

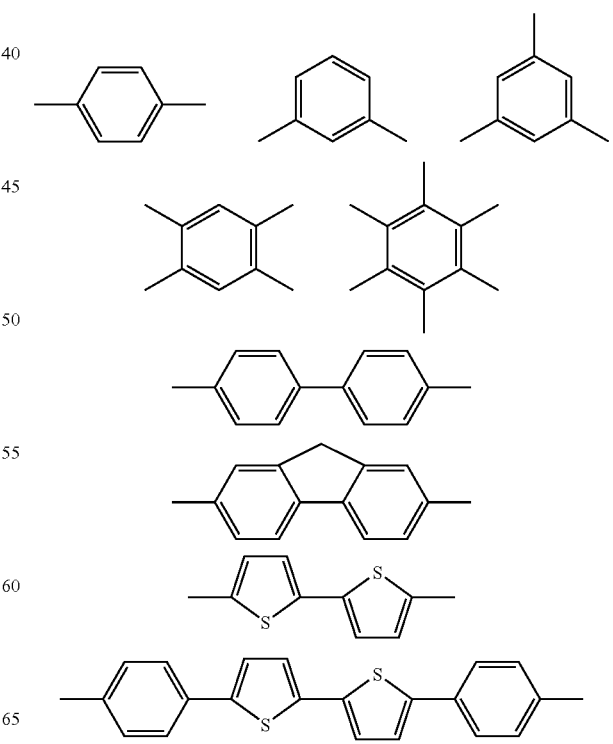

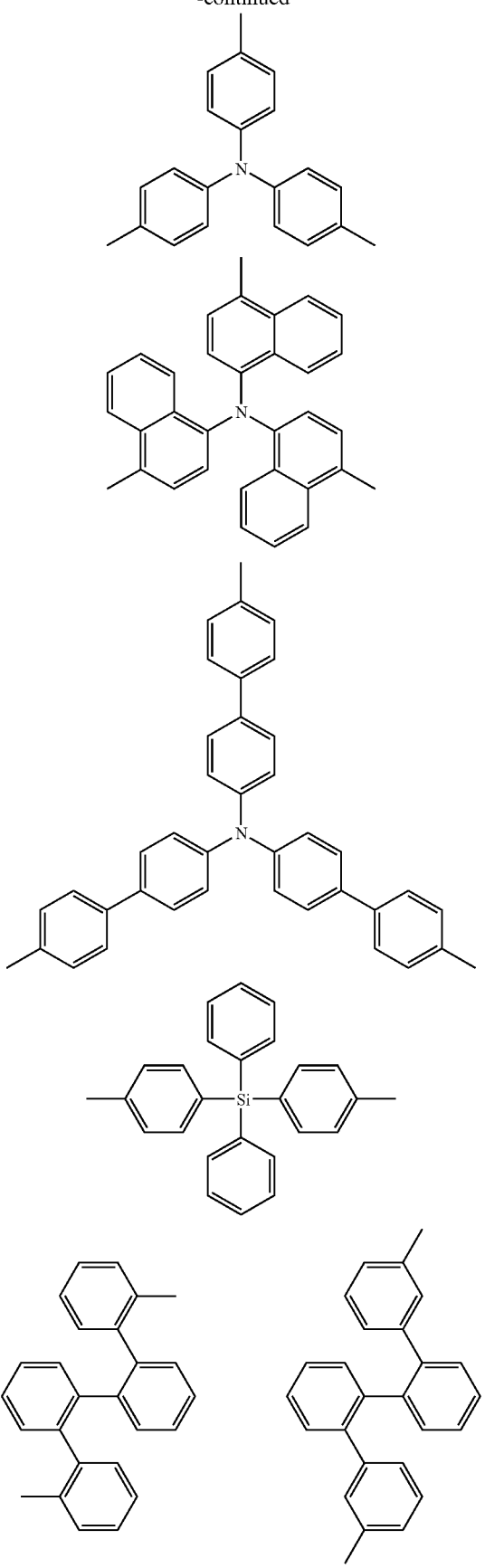

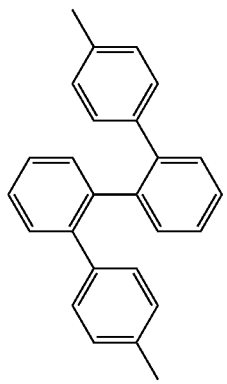 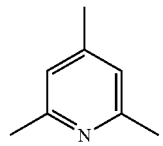

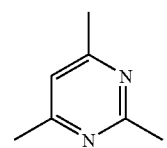 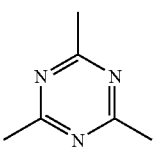

L may have a substituent group and examples of the substituent group are those exemplified for the substituent groups of $R^1$ and $R^2$. The substituent group of L is preferably an alkyl and an aryl.

The reference character n denotes an integer of 2 or larger, preferably an integer from 2 to 6, more preferably an integer from 2 to 4, furthermore preferably an integer 2 or 3, and even more preferably 3.

The compound defined by the formula (A-1) is preferably a compound defined by the following formula (A-2).

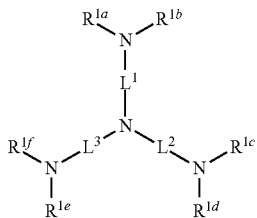

formula (A-2)

In the formula (A-2), $R^{1a}$, $R^{1b}$, $R^{1c}$, $R^{1d}$, $R^{1e}$, and $R^{1f}$ independently denote a hydrogen atom, an aliphatic hydrocarbon group, an aromatic hydrocarbon group, or a heterocyclic group; and $L^1$, $L^2$, and $L^3$ independently denote di- or higher valent bonding group.

The aliphatic hydrocarbon group, aromatic hydrocarbon group, or heterocyclic group denoted by $R^{1a}$, $R^{1b}$, $R^{1c}$, $R^{1d}$, $R^{1e}$, and $R^{1f}$ are same as those exemplified for $R^1$ and $R^2$ in the formula (A-1) and preferable groups are also same.

The di- or higher valent group denoted by $L^1$, $L^2$, and $L^3$ is also same as those exemplified for L in the formula (A-1) and preferable groups are also same.

Specific examples of the compound to be used for the hole injection-promoting layer are shown below, however, the compound is not limited to these exemplified compounds.

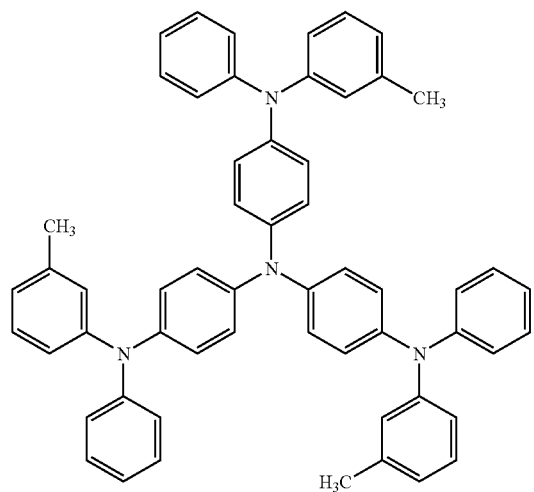
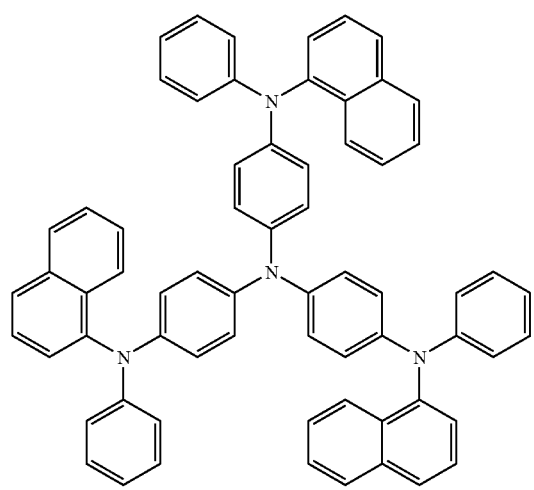
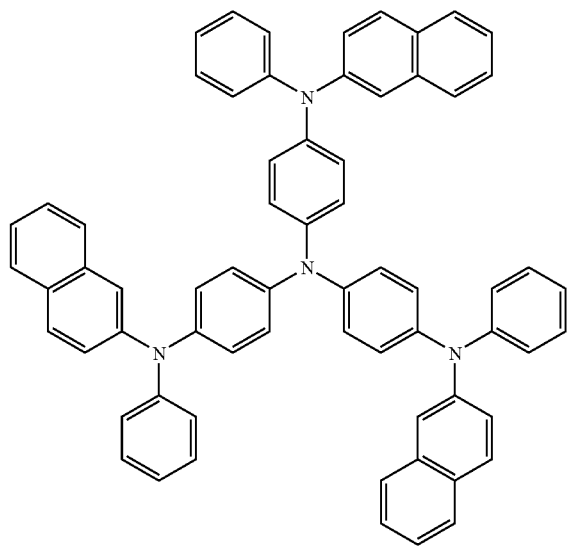

-continued
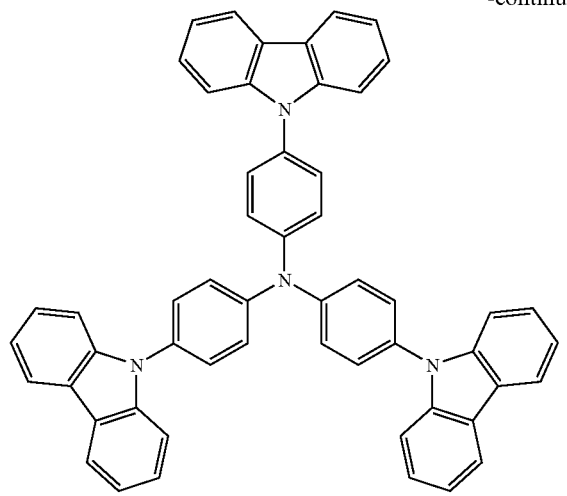
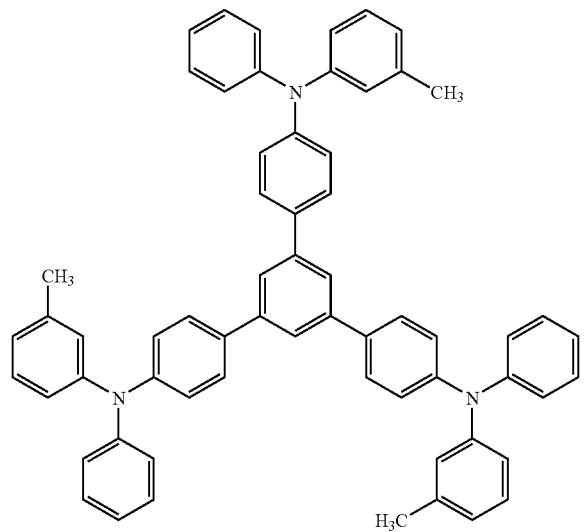
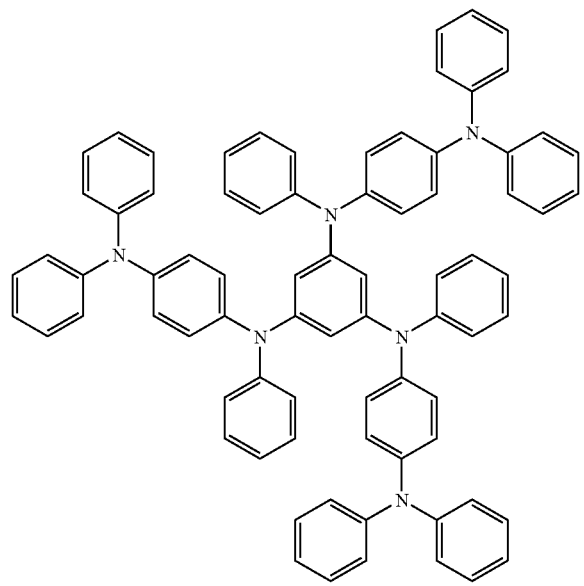

-continued
7.
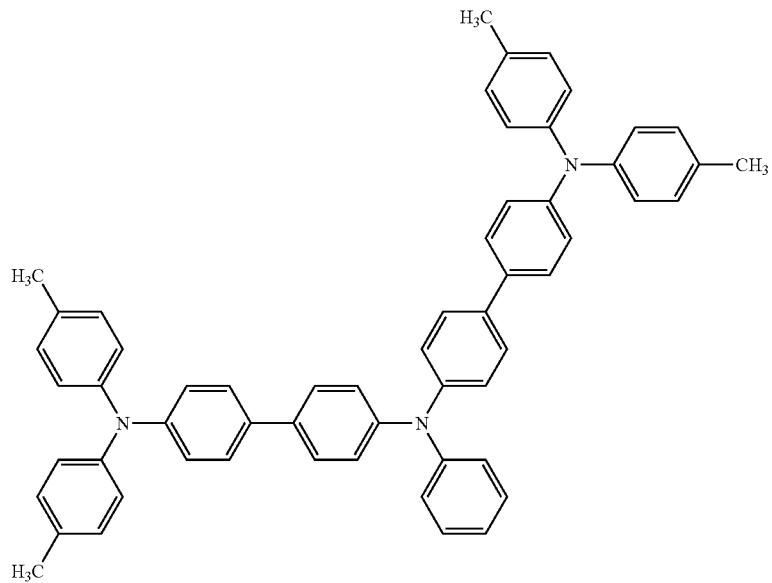
8.
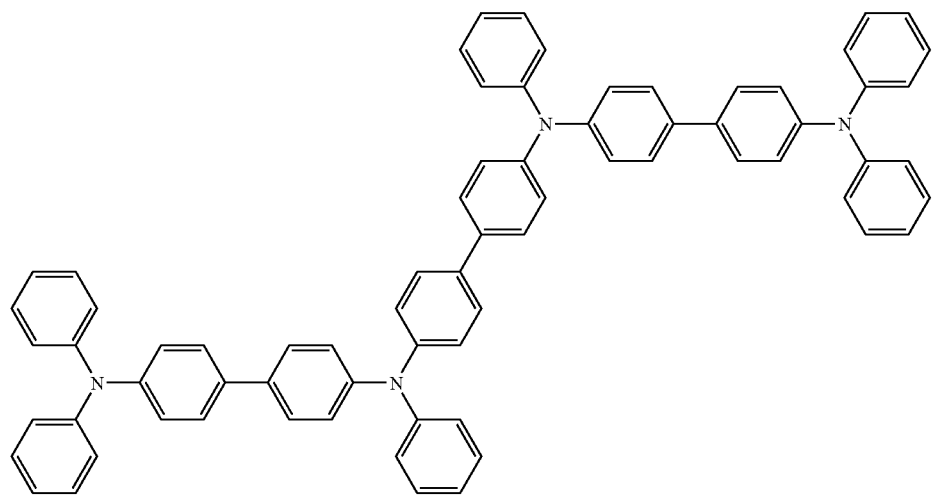
9.
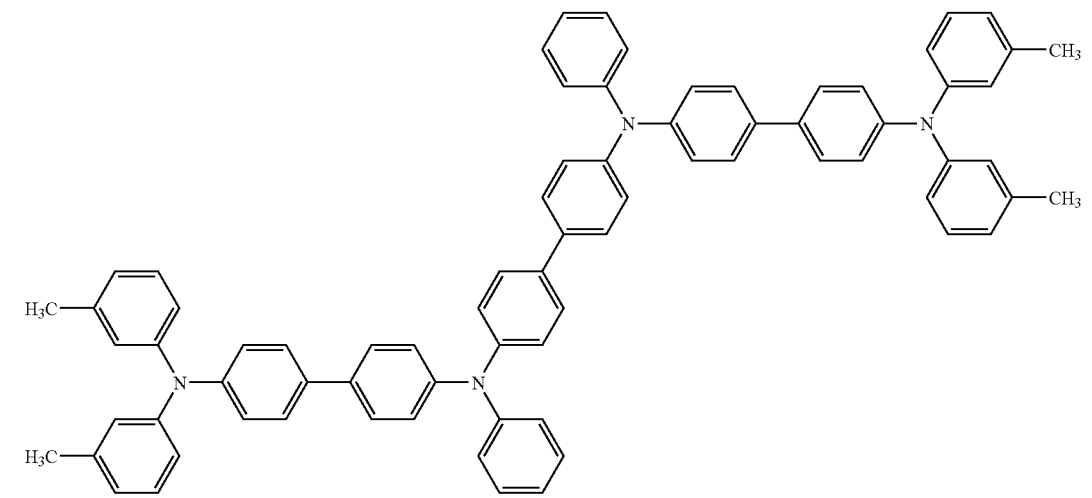

10.
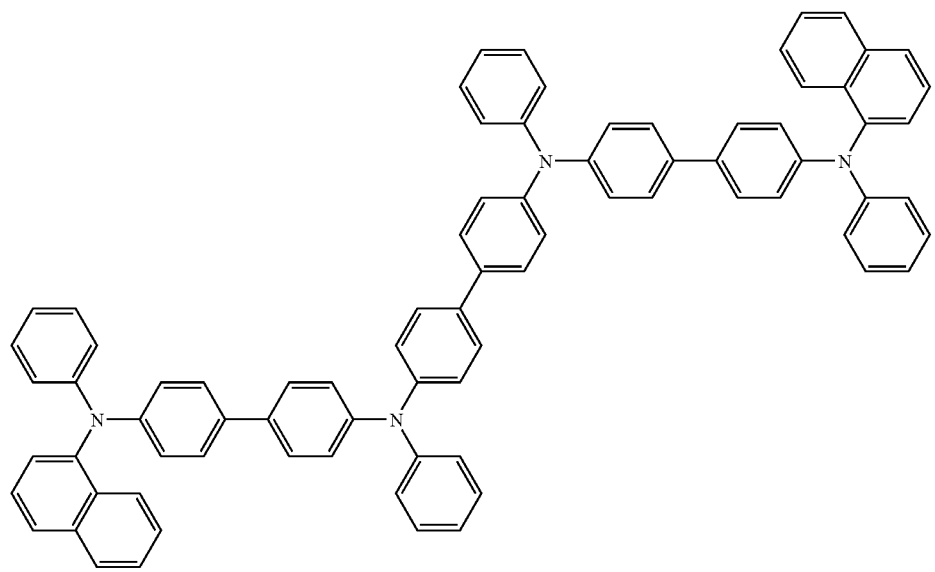
11.
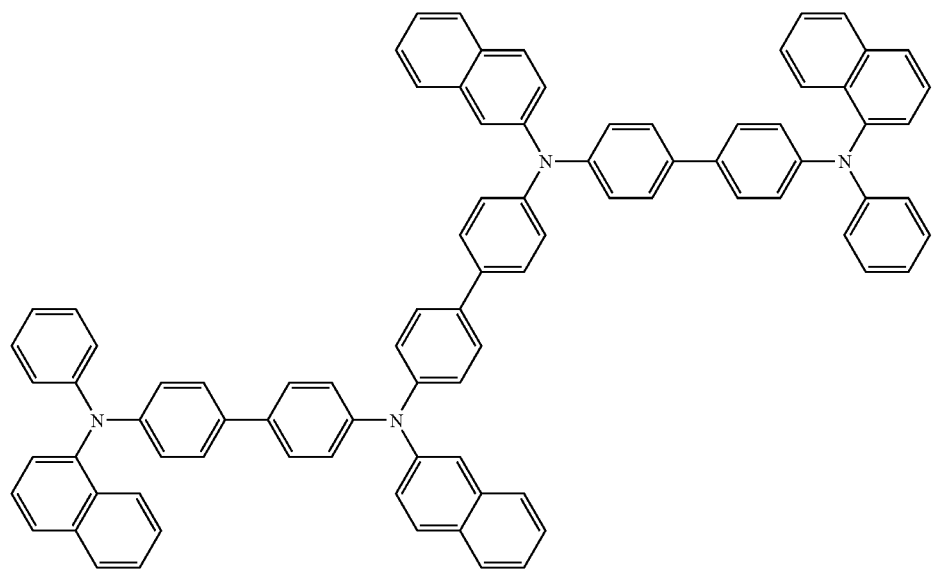

-continued
12.
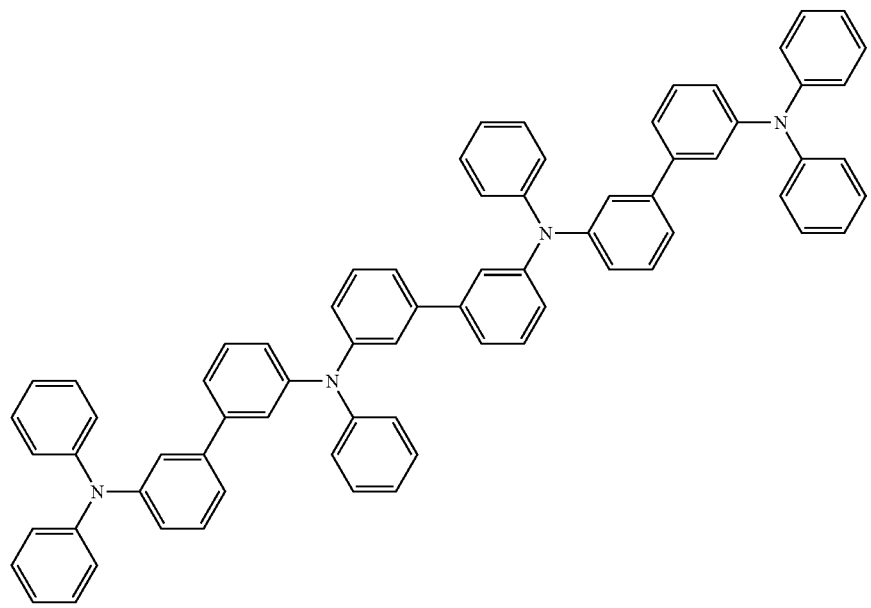
13.
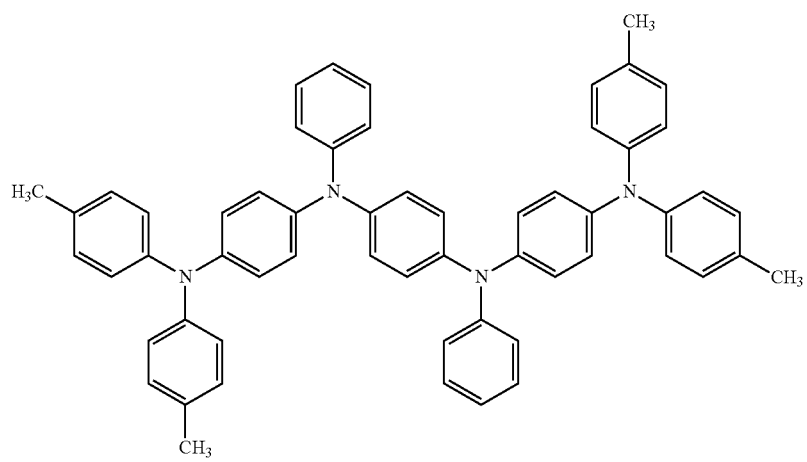
14.
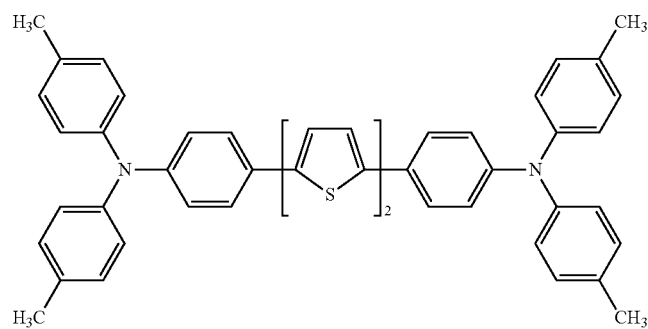

-continued
15.
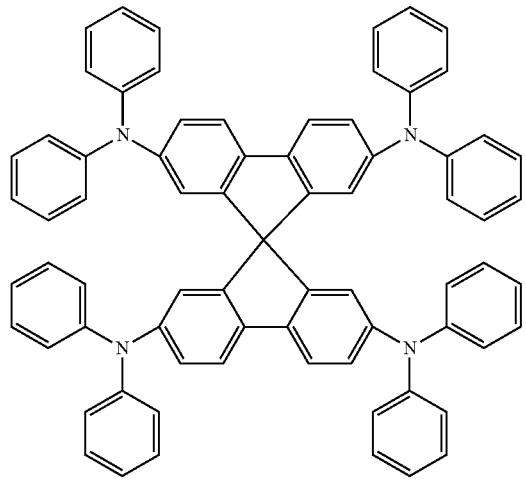
16.
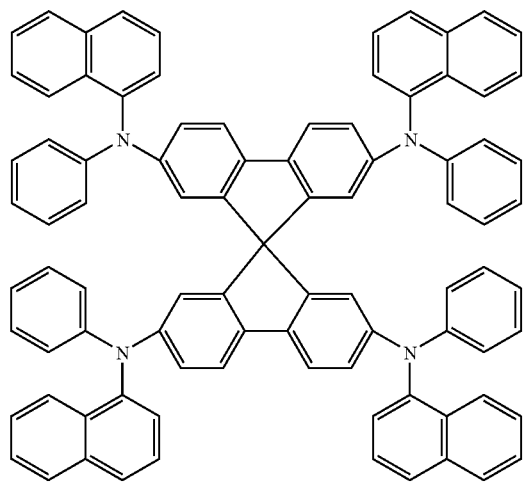
17.
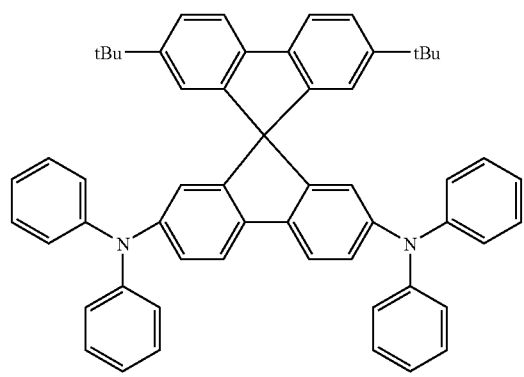
18.
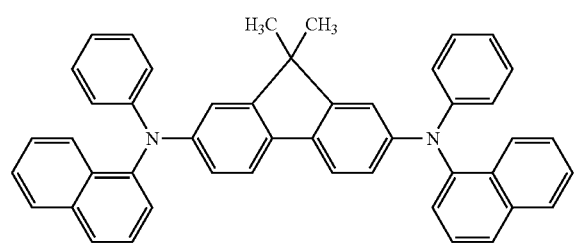

19.
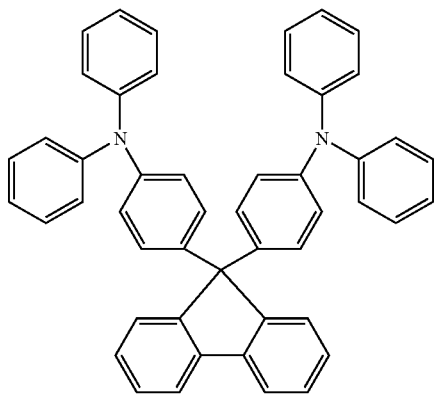
20.
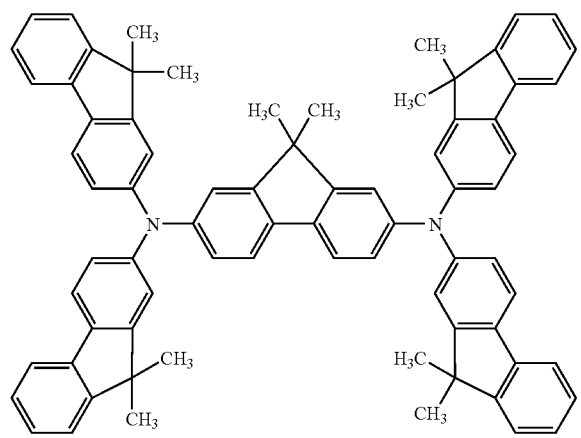
21.
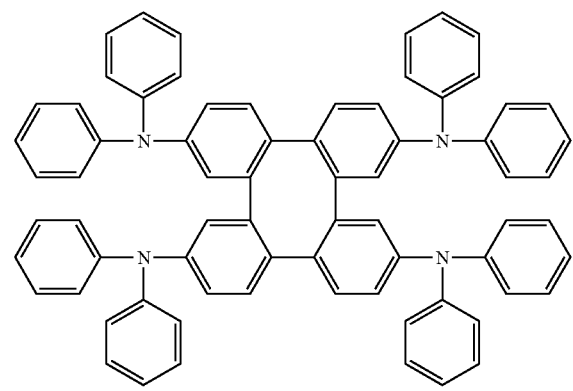
22.
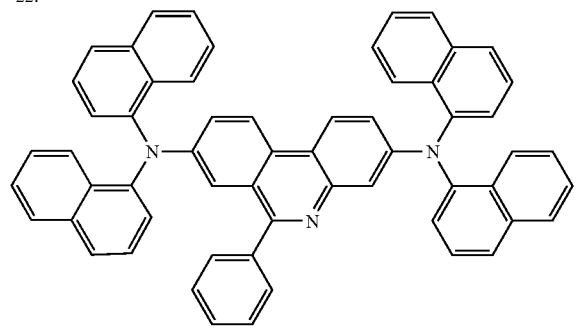

23.

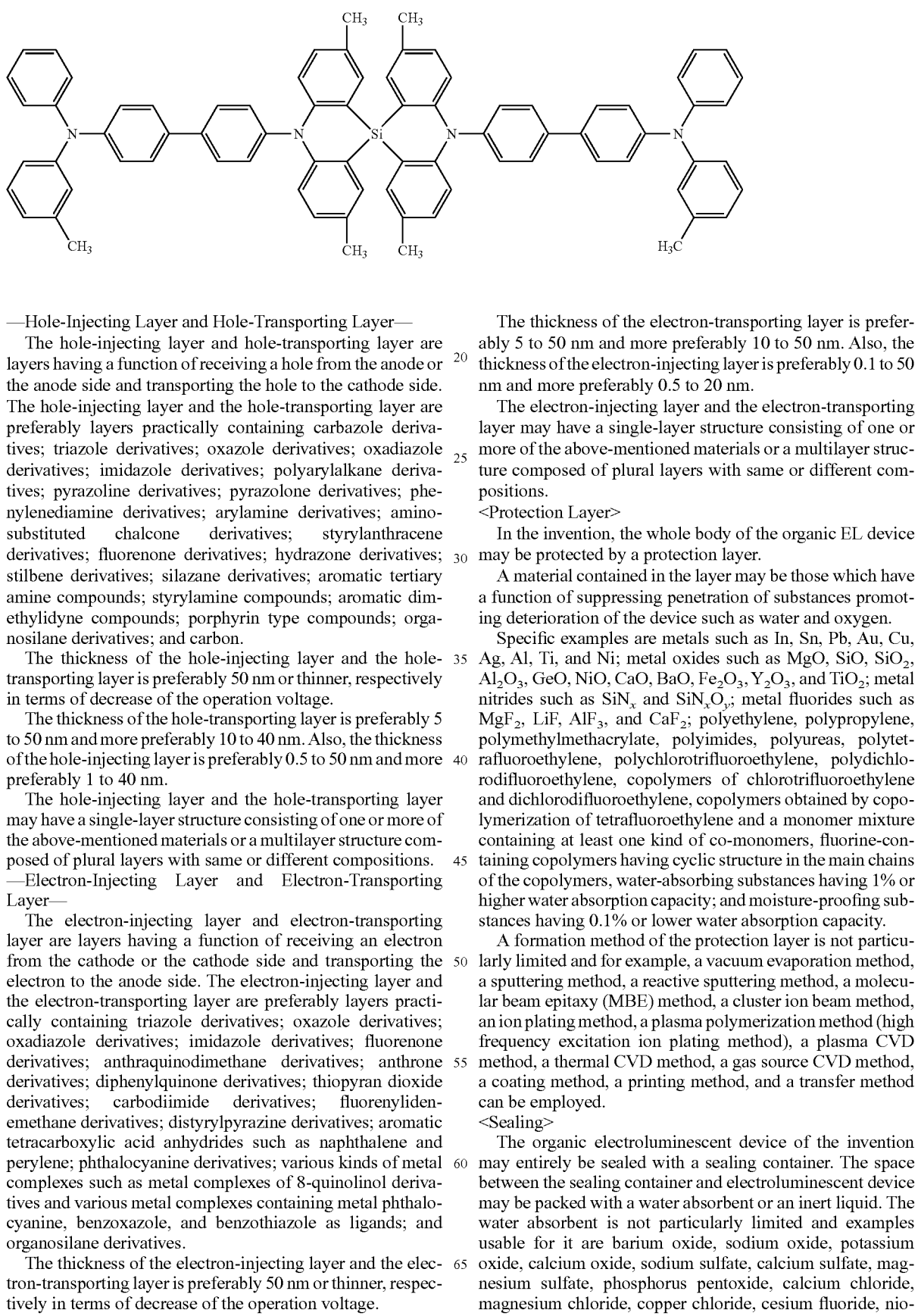

—Hole-Injecting Layer and Hole-Transporting Layer—

The hole-injecting layer and hole-transporting layer are layers having a function of receiving a hole from the anode or the anode side and transporting the hole to the cathode side. The hole-injecting layer and the hole-transporting layer are preferably layers practically containing carbazole derivatives; triazole derivatives; oxazole derivatives; oxadiazole derivatives; imidazole derivatives; polyarylalkane derivatives; pyrazoline derivatives; pyrazolone derivatives; phenylenediamine derivatives; arylamine derivatives; amino-substituted chalcone derivatives; styrylanthracene derivatives; fluorenone derivatives; hydrazone derivatives; stilbene derivatives; silazane derivatives; aromatic tertiary amine compounds; styrylamine compounds; aromatic dimethylidyne compounds; porphyrin type compounds; organosilane derivatives; and carbon.

The thickness of the hole-injecting layer and the hole-transporting layer is preferably 50 nm or thinner, respectively in terms of decrease of the operation voltage.

The thickness of the hole-transporting layer is preferably 5 to 50 nm and more preferably 10 to 40 nm. Also, the thickness of the hole-injecting layer is preferably 0.5 to 50 nm and more preferably 1 to 40 nm.

The hole-injecting layer and the hole-transporting layer may have a single-layer structure consisting of one or more of the above-mentioned materials or a multilayer structure composed of plural layers with same or different compositions.

—Electron-Injecting Layer and Electron-Transporting Layer—

The electron-injecting layer and electron-transporting layer are layers having a function of receiving an electron from the cathode or the cathode side and transporting the electron to the anode side. The electron-injecting layer and the electron-transporting layer are preferably layers practically containing triazole derivatives; oxazole derivatives; oxadiazole derivatives; imidazole derivatives; fluorenone derivatives; anthraquinodimethane derivatives; anthrone derivatives; diphenylquinone derivatives; thiopyran dioxide derivatives; carbodiimide derivatives; fluorenylidenemethane derivatives; distyrylpyrazine derivatives; aromatic tetracarboxylic acid anhydrides such as naphthalene and perylene; phthalocyanine derivatives; various kinds of metal complexes such as metal complexes of 8-quinolinol derivatives and various metal complexes containing metal phthalocyanine, benzoxazole, and benzothiazole as ligands; and organosilane derivatives.

The thickness of the electron-injecting layer and the electron-transporting layer is preferably 50 nm or thinner, respectively in terms of decrease of the operation voltage.

The thickness of the electron-transporting layer is preferably 5 to 50 nm and more preferably 10 to 50 nm. Also, the thickness of the electron-injecting layer is preferably 0.1 to 50 nm and more preferably 0.5 to 20 nm.

The electron-injecting layer and the electron-transporting layer may have a single-layer structure consisting of one or more of the above-mentioned materials or a multilayer structure composed of plural layers with same or different compositions.

<Protection Layer>

In the invention, the whole body of the organic EL device may be protected by a protection layer.

A material contained in the layer may be those which have a function of suppressing penetration of substances promoting deterioration of the device such as water and oxygen.

Specific examples are metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$ and $SiN_xO_y$; metal fluorides such as $MgF_2$, LiF, $AlF_3$, and $CaF_2$; polyethylene, polypropylene, polymethylmethacrylate, polyimides, polyureas, polytetrafluoroethylene, polychlorotrifluoroethylene, polydichlorodifluoroethylene, copolymers of chlorotrifluoroethylene and dichlorodifluoroethylene, copolymers obtained by copolymerization of tetrafluoroethylene and a monomer mixture containing at least one kind of co-monomers, fluorine-containing copolymers having cyclic structure in the main chains of the copolymers, water-absorbing substances having 1% or higher water absorption capacity; and moisture-proofing substances having 0.1% or lower water absorption capacity.

A formation method of the protection layer is not particularly limited and for example, a vacuum evaporation method, a sputtering method, a reactive sputtering method, a molecular beam epitaxy (MBE) method, a cluster ion beam method, an ion plating method, a plasma polymerization method (high frequency excitation ion plating method), a plasma CVD method, a thermal CVD method, a gas source CVD method, a coating method, a printing method, and a transfer method can be employed.

<Sealing>

The organic electroluminescent device of the invention may entirely be sealed with a sealing container. The space between the sealing container and electroluminescent device may be packed with a water absorbent or an inert liquid. The water absorbent is not particularly limited and examples usable for it are barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited and examples usable for it are paraffins, liquid paraffins, fluorine type solvents such as perfluoroalkanes, perfluoroamines, and perfluoro ethers, chlorine-containing solvents, and silicone oils.

The organic electroluminescent device of the invention can emit light by applying direct voltage (if necessary alternating components may be contained) between the anode and the cathode at a voltage (generally 2 V to 15 V) or DC current.

With a method for operating the organic electroluminescent device of the invention, methods described in JP-A Nos. 2-148687, 6-301355, 5-29080, 7-134558, 8-234685, 8-241047, Japanese Patent No. 2784615, and U.S. Pat. Nos. 5,828,429 and 6,023,308 can be employed.

The operation durability of the organic electroluminescent device of the invention can be measured based on the brightness half life at a specified brightness. For example, it can be measured by carrying out a continuous operation test by generating electroluminescence by applying DC voltage to the organic EL device under a condition of an initial brightness of 2000 cd/m$^2$ by using a Source Measure Unit 2400-model manufactured by KEITHLEY and measuring the time when the brightness becomes 1000 cd/m$^2$ as the brightness half life T(½). In the invention, the numerical value measured in the manner is employed.

The light emitting efficiency (cd/A) as the electroluminescence property is measured in the invention by measuring the brightness-current-voltage characteristic simultaneously with measurement of the above-mentioned operation durability.

The organic EL device of the invention is preferably employed for a display device, a display, a back light, electrophotography, an illumination light source, a recording light source, a light source for exposure, a light source for reading, a mark, an advertisement, an interior product, and optical communication.

EXAMPLES

The invention and objects and features thereof will be more readily apparent with reference to examples, however, it is not intended that the invention be limited to the described examples.

Comparative Example 1

An ITO thin film (thickness 0.2 µm) as a transparent anode was formed on a glass substrate with 2.5 cm square and 0.5 mm thickness by DC magnetron sputtering (conditions: substrate temperature: 100° C. and oxygen pressure 1×10$^{-3}$ Pa) using an ITO target having 95% by mass of In$_2$O$_3$ content. The surface resistance of the ITO thin film was 10 Ω/cm$^2$.

Next, the substrate on which the transparent anode was formed was put in a washing container and washed with IPA and subjected to UV-ozone treatment for 30 minutes. Successively, a hole-injecting layer with 10 nm thickness was formed at 0.5 nm/s speed on the transparent anode by a vacuum evaporation method using copper-phthalocyanine (CuPC).

Further, a hole-transporting layer with 30 nm thickness was formed thereon by the vacuum evaporation method using α-NPD [(N,N'-di-α-naphthyl-N,N'-diphenyl)benzidine].

On the hole-transporting layer, a light-emitting layer with 30 nm thickness was obtained by co-depositing mCP (N,N'-dicarbazolyl-3,5-benzene) as a host material in the light-emitting layer and the following light-emitting material 1 as the phosphorescence-emitting material in the light-emitting layer at 100/8 ratio.

Further BAlq was deposited in a thickness of 10 nm at 0.5 nm/s speed by the vacuum evaporation method on the light-emitting layer and further thereon, Alq was deposited at 0.2 nm/s speed by the vacuum evaporation method to obtain electron-injecting layer of 40 nm thickness.

A patterned mask (a mask with which the light emitting surface area is adjusted to be 2 mm×2 mm) was put on the layer obtained above and lithium fluoride was deposited in 1 nm thickness by the vacuum evaporation method. Further, thereon, aluminum was deposited in 0.1 µm thickness by the vacuum evaporation method to form a cathode.

The obtained electroluminescent layered body was put in a globe box whose inside gas was replaced with argon and sealed by using a sealing casing made of a stainless steel having a desiccator and a UV-curable adhesive (trade name: XNR 5516 HV, manufactured by Nagase Ciba) to obtain an electroluminescent device.

The processes from the evaporation of CuPC to the sealing were carried out in vacuum or nitrogen atmosphere and thus the electroluminescent device was fabricated without being exposed to atmospheric air.

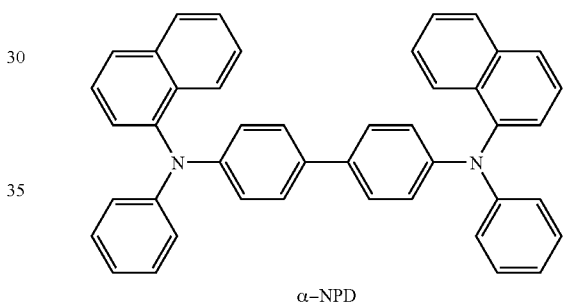

α-NPD

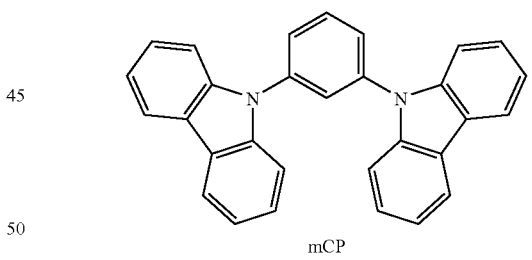

mCP

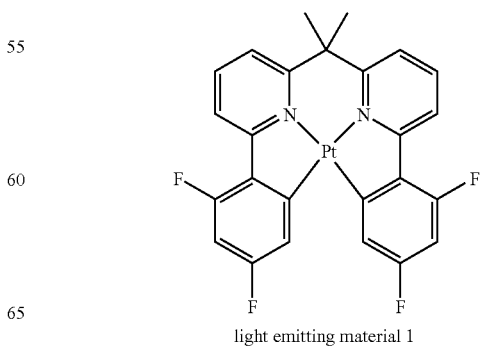

light emitting material 1

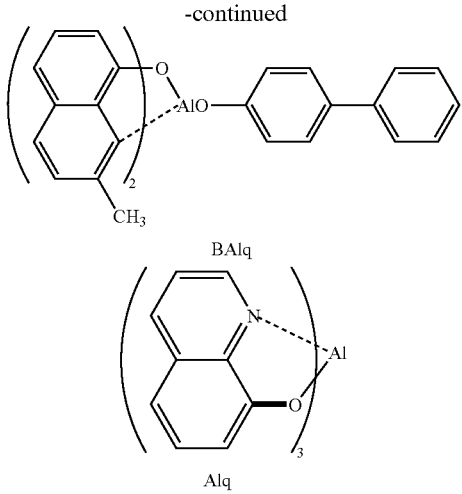

BAlq

Alq

[Evaluation]

The ionization potentials (IP) and the hole mobility of the hole-transporting material of the hole-transporting layer, the hole-transporting material of the hole injection-promoting layer, and the host material of the light-emitting layer were measured by the following method using monolayers of these respective layers. The results are shown in the following Table 1.

—Ionization Potential (IP)—

The ionization potential (IP) was measured at a room temperature and atmospheric pressure by ultraviolet photoelectron analyzer AC-1 (manufactured by Riken Keiki Co., Ltd.).

The operation durability and light emitting efficiency were measured by the following method using the obtained electroluminescent device. The results are shown in the following Table 1.

—Operation Durability Test—

A continuous operation test of the electroluminescent device was carried out under a condition of an initial brightness of 2000 cd/m² and measuring the time when the brightness became a half and the time was defined as the brightness half life T(½).

—Light Emitting Efficiency—

The brightness-current-voltage characteristic was measured by applying voltage to the electroluminescent device and the light emitting efficiency (cd/A) was calculated.

Comparative Examples 2 and 3

Electroluminescent devices were fabricated in the same manner as Comparative Example 1, except that the thickness of the hole-transporting layer was changed to 27 nm from 30 nm, and m-MTDATA in Comparative Example 2, and the following compound C in Comparative Example 3, was deposited in 3 nm thickness at 0.02 nm/s speed by the vacuum evaporation method to form a hole injection-promoting layer between the light-emitting layer and the hole-transporting layer and the electroluminescent devices were subjected to the same evaluation tests. The results are shown in Table 1.

Comparative Example 4

An electroluminescent device was fabricated in the same manner as Comparative Example 1, except that the thickness of the hole-transporting layer was changed to 25 nm from 30 nm and the following compound A was deposited in 5 nm thickness at 0.02 nm/s speed by the vacuum evaporation method to form a hole injection-promoting layer between the light-emitting layer and the hole-transporting layer and the electroluminescent device was subjected to the same evaluation tests. The results are shown in Table 1.

compound A

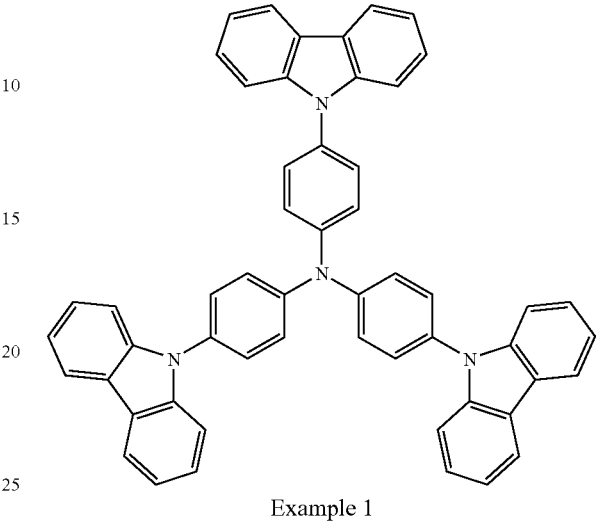

Example 1

An electroluminescent device was fabricated in the same manner as Comparative Example 2, except that the thickness of the vacuum deposited film of the compound A of the hole injection-promoting layer was changed to 3 nm from 5 nm and the electroluminescent device was subjected to the same evaluation tests. The results are shown in Table 1.

Example 2

An electroluminescent device was fabricated in the same manner as Comparative Example 2, except that the thickness of the vacuum deposited film of the compound A of the hole injection-promoting layer was changed to 1.5 nm from 5 nm and the electroluminescent device was subjected to the same evaluation tests. The results are shown in Table 1.

Example 3

An electroluminescent device was fabricated in the same manner as Example 2, except that the compound A was changed to compound B and the electroluminescent device was subjected to the same evaluation tests. The results are shown in Table 1.

compound B

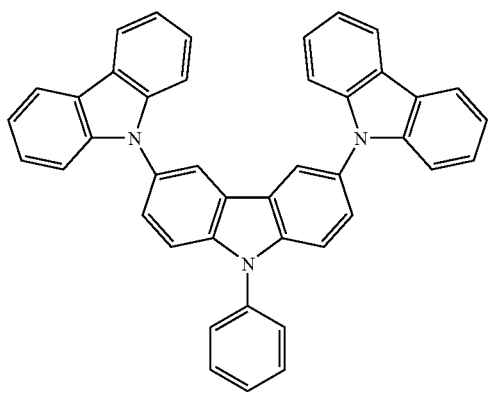

TABLE 1

|  | Comparative Example 1 | Comparative Example 2 | Comparative Example 3 | Comparative Example 4 | Example 1 | Example 2 | Example 3 |
|---|---|---|---|---|---|---|---|
| hole-injecting/-transporting layer | CuPC/NPD | CuPC/NPD | CuPC/NPD | CuPC/NPD | CuPC/NPD | CuPC/NPD | CuPC/NPD |
| hole injection-promoting layer (hole injection suppressing layer in Comparative Examples 2 and 3) | — | m-MTDATA | Compound C | Compound A | Compound A | Compound A | Compound B |
| light-emitting layer — host | mCP | mCP | mCP | mCP | mCP | mCP | mCP |
| light-emitting layer — light emitting material | light emitting material 1 | light emitting material 1 | light emitting material 1 | Light emitting material 1 | light emitting material 1 | light emitting material 1 | light emitting material 1 |
| electron-transporting layer | BAlq/Alq | BAlq/Alq | BAlq/Alq | BAlq/Alq | BAlq/Alq | BAlq/Alq | BAlq/Alq |
| film thickness of hole injection-promoting layer (nm) (hole injection suppressing layer in Comparative Examples 2 and 3) | — | 3.0 | 3.0 | 5.0 | 3.0 | 1.5 | 1.5 |
| IP (eV) of hole-transporting material in hole-transporting layer | 5.4 | 5.4 | 5.4 | 5.4 | 5.4 | 5.4 | 5.4 |
| IP (eV) of hole-transporting material in hole injection-promoting layer | — | 5.1 | 6.2 | 5.7 | 5.7 | 5.7 | 5.8 |
| IP (eV) of host material in light-emitting layer | 6.0 | 6.0 | 6.0 | 6.0 | 6.0 | 6.0 | 6.0 |
| hole mobility (cm$^2$/Vs) of hole-transporting material in the hole injection-promoting layer | — | $4.3 \times 10^{-5}$ | $3.5 \times 10^{-4}$ | $1.2 \times 10^{-3}$ | $1.2 \times 10^{-3}$ | $1.2 \times 10^{-3}$ | $5.0 \times 1.0^{-4}$ |
| operation durability (initial brightness @2000 cd/m$^2$, brightness half life (hr)) | 1400 | 620 | 560 | 1200 | 3900 | 4200 | 4000 |
| light emitting efficiency (cd/A) (@ 2000 cd/m$^2$) | 14 | 6 | 7 | 13 | 13 | 13.5 | 13 |

As being made clear in Table 1, the operation durability of the devices of Examples are considerably improved without decreasing the light emitting efficiency as compared with that of the device of Comparative Example 1, and the effect of the hole injection-promoting layer is confirmed.

From the comparison between Comparative Example 4 and Examples, the thickness of not more than 3 nm in the hole-injection layer is confirmed to be effective.

Figure 1B:
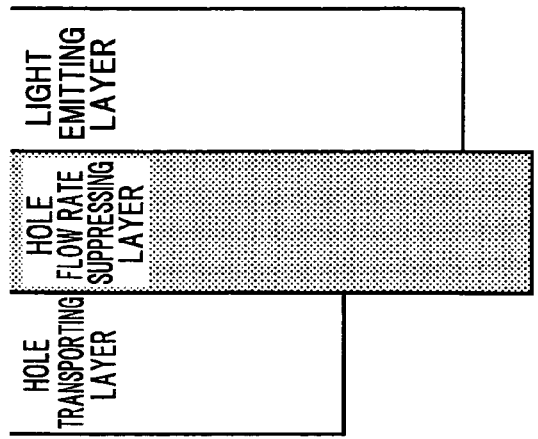
FIG. 1B is a schematic drawing showing the relative relation of the ionization potential IP among the respective organic layers of the electroluminescent device disclosed in JP-A 2003-123984.
Figure 1C:
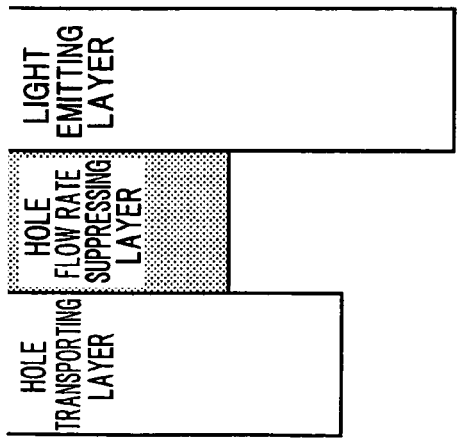
FIG. 1C is a schematic drawing showing the relative relation of the ionization potential IP among the respective organic layers of an electroluminescent device of the invention.

As being shown in Comparative Example 2 (corresponding to the diagram of FIG. 1A) and Comparative Example 3 (corresponding to the diagram of FIG. 1B), it is confirmed that the deposition of the hole injection-suppressing layer causes to decrease in the light emitting efficiency and the operation durability.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic electroluminescent device comprising: a light-emitting layer containing a light-emitting material and a host material; a hole injection-promoting layer; and a hole-transporting layer containing a hole-transporting material; provided in this order between a pair of electrodes;
   wherein the hole injection-promoting layer contains a hole-transporting material and has a thickness of 0.1 nm to 3 nm; and the relationship Ip1<Ip2<Ip3 is satisfied, when Ip1 is defined as the ionization potential of the hole-transporting material of the hole-transporting layer, Ip2 is defined as the ionization potential of the hole-transporting material of the hole injection-promoting layer, and Ip3 is defined as the ionization potential of the host material;
   wherein the light-emitting material is a phosphorescence emitting material, and
   wherein the hole injection-promoting layer is in the form of islands.

2. The organic electroluminescent device of claim 1, wherein the phosphorescence-emitting material is a complex containing a transition metal atom or a lanthanide atom.

3. The organic electroluminescent device of claim 1, wherein the hole injection-promoting layer has a film thickness in a range from 0.1 nm to 2 nm.

4. The organic electroluminescent device of claim 1, wherein the ionization potential Ip2 of the hole-transporting material of the hole injection-promoting layer is 5.4 eV or higher.

5. The organic electroluminescent device of claim 1, wherein the electron affinity (Ea) of the hole-transporting material of the hole injection-promoting layer is 2.3 eV or higher.

6. The organic electroluminescent device of claim 1, wherein the hole injection-promoting layer is adjacent to the light-emitting layer at the anode side.

7. The organic electroluminescent device of claim 1, wherein the light-emitting layer and the hole-transporting layer contact each other partly.

8. The organic electroluminescent device of claim 1, wherein the hole-transporting material of the hole injection-promoting layer is defined by the following formula (A-1):

formula (A-1)

wherein in the formula: $R^1$ and $R^2$ independently denote a hydrogen atom, an aliphatic hydrocarbon group, an aromatic hydrocarbon group, or a heterocyclic group; L denotes a di- or higher valent bonding group; n denotes an integer of 2 or larger; a plurality of groups defined respectively by $R^1$ or $R^2$ may be the same or different from each other.

9. The organic electroluminescent device of claim 8, wherein the hole-transporting material of the hole injection-promoting layer is defined by the following formula (A-2):

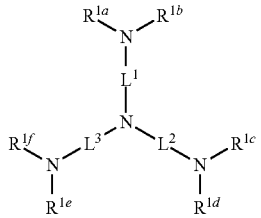

formula (A-2)

wherein in the formula: $R^{1a}$, $R^{1b}$, $R^{1c}$, $R^{1d}$, $R^{1e}$ and $R^{1f}$ independently denote a hydrogen atom, an aliphatic hydrocarbon group, an aromatic hydrocarbon group, or a heterocyclic group; and $L^1$, $L^2$, and $L^3$ independently denote a di- or higher valent bonding group.

* * * * *